(12) United States Patent
Chen

(10) Patent No.: US 8,537,963 B2
(45) Date of Patent: Sep. 17, 2013

(54) SHIFT REGISTER WITH VOLTAGE BOOSTING CIRCUIT

(75) Inventor: Chung-Chun Chen, Hsin-Chu (TW)

(73) Assignee: Au Optronics Corp., Hsinchu (TW)

( * ) Notice: Subject to any disclaimer, the term of this patent is extended or adjusted under 35 U.S.C. 154(b) by 156 days.

(21) Appl. No.: 13/160,692

(22) Filed: Jun. 15, 2011

(65) Prior Publication Data

US 2012/0163529 A1    Jun. 28, 2012

(30) Foreign Application Priority Data

Dec. 27, 2010   (TW) .............................. 99146163 A

(51) Int. Cl.
  *G11C 19/00*   (2006.01)
(52) U.S. Cl.
  USPC .............................................. 377/64; 377/67
(58) Field of Classification Search
  USPC ...................................................... 377/64, 67
  See application file for complete search history.

(56) References Cited

U.S. PATENT DOCUMENTS

| | | | |
|---|---|---|---|
| 5,949,271 A | 9/1999 | Fujikura | |
| 6,801,194 B2 | 10/2004 | Miyazawa et al. | |
| 7,352,839 B2 | 4/2008 | Yu | |
| 2009/0135991 A1* | 5/2009 | Chen | 377/79 |
| 2010/0111245 A1* | 5/2010 | Tobita | 377/64 |
| 2010/0141641 A1 | 6/2010 | Furuta et al. | |
| 2010/0166136 A1* | 7/2010 | Tobita | 377/67 |
| 2010/0201666 A1* | 8/2010 | Tobita | 345/208 |
| 2010/0226473 A1 | 9/2010 | Liu et al. | |
| 2012/0027160 A1* | 2/2012 | Tobita | 377/64 |
| 2012/0183117 A1* | 7/2012 | Tobita | 377/67 |
| 2012/0213323 A1* | 8/2012 | Tsai | 377/64 |
| 2012/0307959 A1* | 12/2012 | Furuta et al. | 377/64 |

FOREIGN PATENT DOCUMENTS

| | | |
|---|---|---|
| CN | 101178939 | 5/2008 |
| CN | 101521043 | 9/2009 |
| CN | 101785065 | 7/2010 |
| JP | 2008299941 | 12/2008 |
| JP | 2010108567 | 5/2010 |

OTHER PUBLICATIONS

China Office Action issued on Jul. 20, 2012.

* cited by examiner

*Primary Examiner* — Ryan Jager
(74) *Attorney, Agent, or Firm* — WPAT, PC; Justin King

(57) ABSTRACT

An exemplary shift register is adapted for receiving a preceding-stage output signal to generate a preceding-stage supply signal and outputting an input signal as an extreme value of a current-stage output signal according to the preceding-stage supply signal. The shift register includes an active controller, a voltage boosting circuit and an output circuit. The active controller receives the preceding-stage output signal and thereby produces an active control signal. The voltage boosting circuit receives a first operating voltage, the preceding-stage supply signal and the active control signal, and uses a capacitive coupling effect to change the voltage value of the preceding-stage supply signal and thereby generates an output control signal. The output circuit is electrically coupled to the voltage boosting circuit, the active controller and the input signal and determines the time of outputting the input signal as the extreme value according to the output control signal.

8 Claims, 5 Drawing Sheets

SHIFT REGISTER WITH VOLTAGE BOOSTING CIRCUIT

TECHNICAL FIELD

The disclosure relates to shift registers and more particularly, to a shift register with improved driving capability.

DESCRIPTION OF THE RELATED ART

Nowadays, the low temperature poly-silicon (LTPS) type liquid crystal display device design has been a main trend for developing consumer electronic products, and primarily used for display devices with high integration and high image quality. In order to meet the requirements of cost down and narrow border for the display devices, the solution of gate driving circuits built in the display devices has been a design trend.

In a conventional dynamic shift register, a gate voltage of a driving transistor is firstly pre-charged to a conduction state in a linear range and then the gate of the driving transistor is floated, and subsequently owing to a voltage level shift of clock signal and accompanying level shift of the previous gate pre-charge voltage, the output of the dynamic shift register can achieve a full-range voltage level.

However, since a pre-charge controller in the conventional dynamic shift register would result in the loss of threshold voltage during providing the gate pre-charge voltage, and the threshold voltage variation in the LTPS process generally is considerably large, so that the driving capability of the output of the conventional dynamic shift register is seriously influenced.

SUMMARY OF DISCLOSURE

Therefore, the disclosure is directed to a shift register, for compensating the threshold voltage and thereby improving the driving capability of the output of the shift register.

More specifically, a shift register in accordance with an embodiment is adapted for receiving a preceding-stage output signal to thereby generate a preceding-stage supply signal and outputting an input signal as an extreme value of a current-stage output signal according to the preceding-stage supply signal. In the exemplary embodiment, the shift register includes an active controller, a voltage boosting circuit and an output circuit. The active controller receives the preceding-stage output signal and thereby provides an active control signal corresponding to the preceding-stage output signal. The voltage boosting circuit receives a first operating voltage, the preceding-stage supply signal and the active control signal. The voltage boosting circuit uses a capacitive coupling effect to change a voltage value of the preceding-stage supply signal and thereby generates an output control signal. The output circuit is electrically coupled to the voltage boosting circuit, the active controller and the input signal. The output circuit determines the time of outputting the input signal as the extreme value of the current-stage output signal according to the output control signal generated from the voltage boosting circuit.

In one embodiment, the output circuit includes a transistor being received the input signal and the output control signal, and the transistor determines the time of outputting the input signal as the extreme value of the current-stage output signal according to the output control signal.

In one embodiment, the voltage boosting circuit includes first through fourth transistors. In particular, a control terminal of the first transistor receives the preceding-stage supply signal, a first terminal of the first transistor receives the first operating voltage, and thereby the first transistor is controlled by the preceding-stage supply signal to determine whether allowing the first operating voltage to be delivered to a second terminal of the first transistor. A control terminal of the second transistor receives the active control signal, a first terminal of the second transistor is electrically coupled to the second terminal of the first transistor, a second terminal of the second transistor receives a second operating voltage, and thereby the second transistor is controlled by the active control signal to determine whether allowing the second operating voltage to be delivered to the first terminal of the second transistor. A control terminal of the third transistor receives the preceding-stage supply signal, a first terminal of the third transistor receives the first operating voltage, and thereby the third transistor is controlled by the preceding-stage supply signal to determine whether allowing the first operating voltage to be delivered to a second terminal of the third transistor as the output control signal. A control terminal of the fourth transistor is electrically coupled to the second terminal of the third transistor to receive the output control signal, a first terminal of the fourth transistor receives the first operating voltage, a second terminal of the fourth transistor receives the preceding-stage supply signal, and thereby the fourth transistor is controlled by the output control signal to determine whether allowing the first operating voltage to be delivered to the second terminal of the fourth transistor.

In another embodiment, the voltage boosting circuit includes first through fourth transistors. A control terminal of the first transistor receives the preceding-stage supply signal, a first terminal of the first transistor receives the first operating voltage, and thereby the first transistor is controlled by the preceding-stage supply signal to determine whether allowing the first operating voltage to be delivered to a second terminal of the first transistor as the output control signal. A control terminal of the second transistor receives the active control signal, a first terminal of the second transistor is electrically coupled to the second terminal of the first transistor, a second terminal of the second transistor receives the current-stage output signal, and thereby on-off states of the second transistor is controlled by the active control signal. A control terminal of the third transistor is electrically coupled to the second terminal of the first transistor to receive the output control signal, a first terminal of the third transistor receives the first operating voltage, a second terminal of the third transistor receives the preceding-stage supply signal, and thereby the third transistor is controlled by the output control signal to determine whether allowing the first operating voltage to be delivered to the second terminal of the third transistor. A control terminal of the fourth transistor receives the active control signal, a first terminal of the fourth transistor receives the current-stage output signal, a second terminal of the fourth transistor receives a second operating voltage, and thereby on-off states of the fourth transistor is controlled by the active control signal.

In still another embodiment, the voltage boosting circuit includes first through third transistors. A control terminal of the first transistor receives the preceding-stage supply signal, a first terminal of the first transistor receives the first operating voltage, and thereby the first transistor is controlled by the preceding-stage supply signal to determine whether allowing the first operating voltage to be delivered to a second terminal of the first transistor as the output control signal. A control terminal of the second transistor receives the active control signal, a first terminal of the second transistor is electrically coupled to the second terminal of the first transistor, a second terminal of the second transistor receives a second operating voltage, and thereby the second transistor is controlled by the active control signal to determine whether allowing the second operating voltage to be delivered to the first terminal of the second transistor. A control terminal of the third transistor is electrically coupled to the second terminal of the first transistor to receive the output control signal, a first terminal of the third transistor receives the first operating voltage, a second terminal of the third transistor receives the preceding-stage supply signal, and thereby the third transistor is controlled by the output control signal to determine whether allowing the first operating voltage to be delivered to the second terminal of the third transistor.

In one embodiment, the voltage boosting circuit includes a bootstrap inverter, and the bootstrap inverter receives the first operating voltage, the preceding-stage supply signal and the active control signal and thereby generates the output control signal.

In one embodiment, the shift register further includes a transistor. The transistor receives the preceding-stage output signal and subjected to the control of a preset control signal to determine whether delivering the preceding-stage output signal as the preceding-stage supply signal. The preset control signal may be the first operating voltage or a signal phase-inverted to the input signal. Moreover, the voltage level of the output control signal in a pre-charge range of the shift register is not relevant to a threshold voltage of the transistor, for example, is approximately equal to the first operating voltage.

In summary, the embodiments add the voltage boosting circuit in the shift register, which can facilitate the voltage level of the output control signal in the pre-charge range of the shift register to be approximately up to the first operating voltage, so that the insufficient driving capability of the shift register caused by the process variation of threshold voltage can be compensated, achieving the purpose of developing the present invention.

BRIEF DESCRIPTION OF THE DRAWINGS

The above objects and advantages will become more readily apparent to those ordinarily skilled in the art after reviewing the following detailed description and accompanying drawings.

DETAILED DESCRIPTION OF EMBODIMENTS

The present invention will now be described more specifically with reference to the following embodiments. It is to be noted that the following descriptions of embodiments are presented herein for purpose of illustration and description only. It is not intended to be exhaustive or to be limited to the precise form disclosed.

[First Embodiment]

Figure 1A:
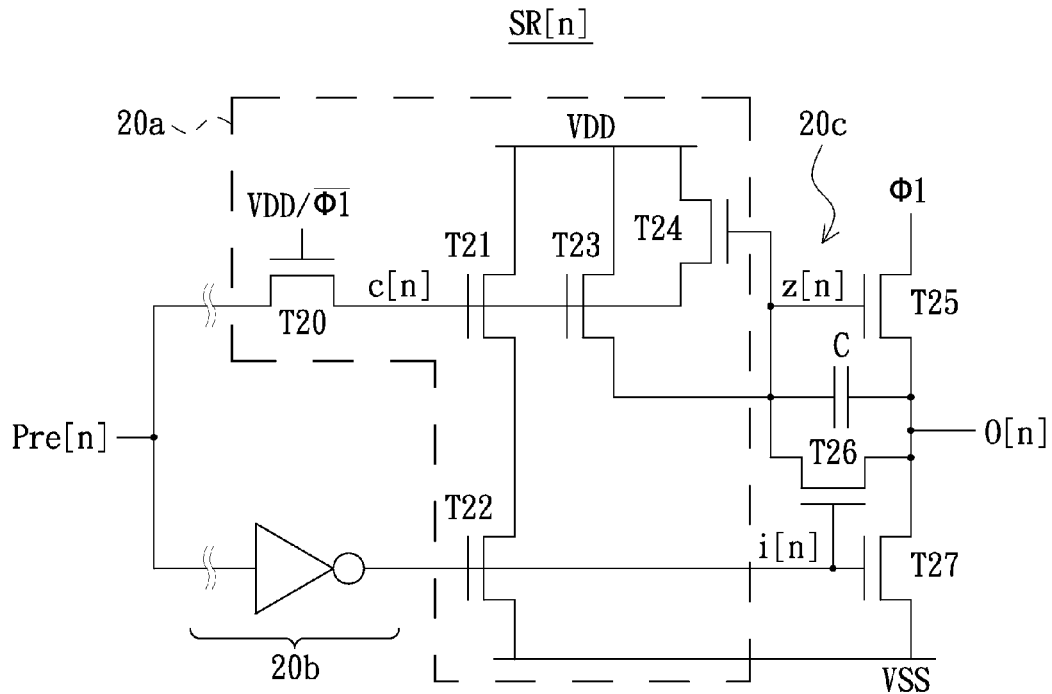
FIG. 1A is a schematic circuit structure of a single stage shift register in accordance with a first embodiment.

Referring to FIG. 1A, a schematic circuit structure of a single stage shift register in accordance with the first embodiment is shown. It is noted that, the first embodiment only take the circuit structure of the single stage shift register SR[n] as an example for the purpose of illustration, but in actual application, multiple stages of shift registers connected in cascade generally are used for applying to a driving circuit for example a gate driving circuit of display device, and an output signal of each of the shift registers may be used as a control signal of its firstly succeeding-stage shift register. In particular, as depicted in FIG. 1A, the shift register SR[n] includes a pre-charge controller 20a, an active controller 20b and an output circuit 20c. The pre-charge controller 20a includes n-type transistors T20, T21, T22, T23, T24, and the n-type transistors T21, T22, T23, T24 in the first embodiment cooperatively constitute a voltage boosting circuit. The transistors T21 and T22 in the voltage boosting circuit constitute a bootstrap inverter. The active controller 20b receives a preceding-stage output signal Pre[n] (e.g., an output signal of the not shown shift register SR[n-1] firstly preceding the shift register SR[n]) and thereby provides an active control signal i[n] corresponding to the preceding-stage output signal Pre[n]. The circuit structure of the active controller 20b can be the same as well-known, and thus will not be described herein. The output circuit 20c includes n-type transistors T25, T26, T27 and a capacitor C.

In the pre-charge controller 20a, the transistor T20 receives the preceding-stage output signal Pre[n] and subjected to the control of a control signal e.g., an operating voltage VDD or a phase-inverted signal $\overline{\Phi 1}$ of an input signal $\Phi 1$ to determine whether delivering the preceding-stage output signal Pre[n] as a preceding-stage supply signal c[n] for output. The voltage boosting circuit constituted by the transistors T21, T22, T23, T24 receives the operating voltage VDD, the preceding-stage supply signal c[n] and the active control signal i[n] and thereby generates an output control signal z[n]. In the first embodiment, the drain (first terminal) of the transistor T21 receives the operating voltage VDD, the gate (control terminal) of the transistor T21 receives the preceding-stage supply signal c[n], and thereby the transistor T21 is controlled by the preceding-stage output signal c[n] to determine whether allowing the operating voltage VDD to be delivered to the source (second terminal) of the transistor T21. The drain (first terminal) of the transistor T22 is electrically coupled to the source of the transistor T21, the source (second terminal) of the transistor T22 receives another operating voltage VSS, the gate (control terminal) of the transistor T22 receives the active control signal i[n], and thereby the transistor T22 is controlled by the active control signal i[n] to determine whether allowing the operating voltage VSS to be delivered to the drain of the transistor T22. The drain (first terminal) of the transistor T23 receives the operating voltage VDD, the gate (control terminal) of the transistor T23 receives the preceding-stage supply signal c[n], and thereby the transistor T23 is controlled by the preceding-stage supply signal c[n] to determine whether allowing the operating voltage VDD to be delivered to the source (second terminal) of the transistor T23 as the output control signal z[n]. The drain (first terminal) of the transistor T24 receives the operating voltage VDD, the source (second terminal) of the transistor T24 receives the preceding-stage supply signal c[n], the gate (control terminal) of the transistor T24 is electrically coupled to the source of the transistor T23 to receive the output control signal z[n], and thereby the transistor T24 is controlled by the output control signal z[n] to determine whether allowing the operating voltage VDD to be delivered to the source of the transistor T24.

In the output circuit 20c, the drain of the transistor T25 receives the input signal Φ1, the source of the transistor T25 is electrically coupled to the gate of the transistor T25 through the capacitor C, the gate of the transistor T25 receives the output control signal z[n], and thereby the transistor T25 is controlled by the output control signal z[n] to determine the time of outputting the input signal Φ1 to the source of the transistor T25 as a current-stage output signal O[n]. In the first embodiment, a logic high (in the embodiment, the highest voltage level in the system can define as logic high, i.e., generally the electronic representation of the binary digit "1") level of the input signal Φ1 determines the logic high level (extreme value) of the current-stage output signal O[n]. The drain of the transistor T26 is electrically coupled to the gate of the transistor T25, the source of the transistor T26 is electrically coupled to the source of the transistor T25, and the gate of the transistor T26 receives the active control signal i[n]. The drain of the transistor T27 is electrically coupled to the source of the transistor T25, the source of the transistor T27 receives the operating voltage VSS, and the gate of the transistor T27 receives the active control signal i[n].

Figure 1B:
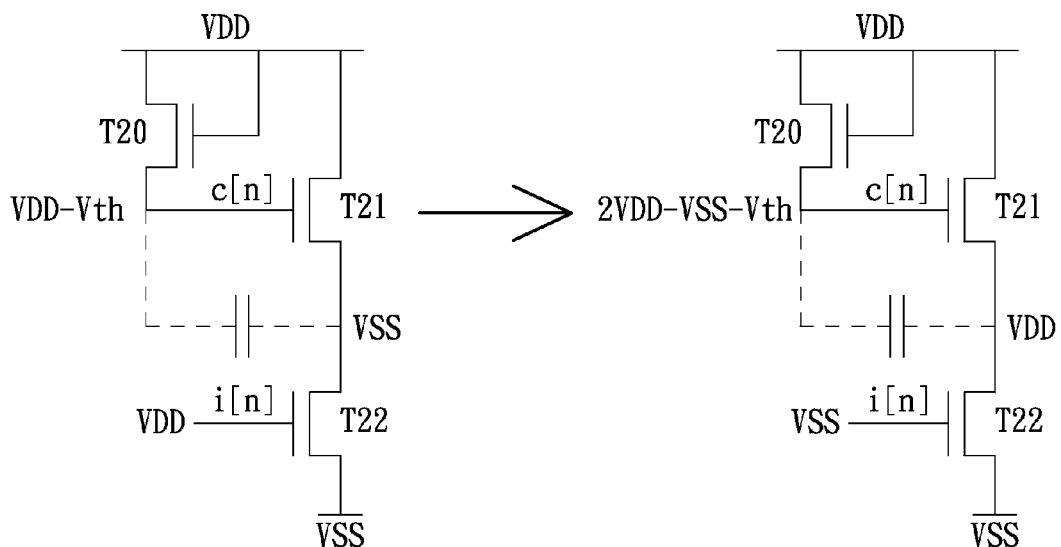
FIG. 1B is an operation principle of a bootstrap inverter in FIG. 1A.
Figure 1C:
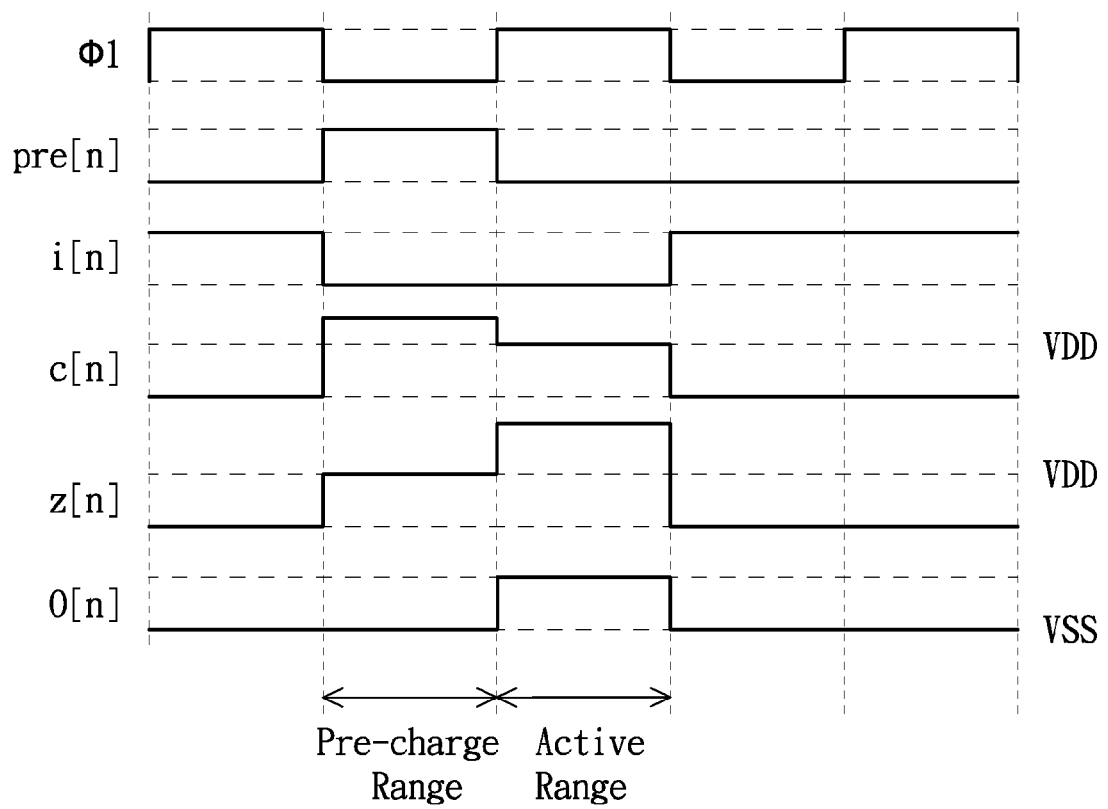
FIG. 1C is operation waveforms associated with the shift register of FIG. 1A.

Referring to FIGS. 1A, 1B and 1C together, FIG. 1B showing an operation principle of the bootstrap inverter constituted by the transistors T21, T22, and FIG. 1C showing operation waveforms associated with the shift register SR[n] of the first embodiment. As depicted in FIG. 1B, when the voltage level of the active control signal i[n] is at the operating voltage VDD, the transistors T20, T22 are turned on, the voltage level of the preceding-stage supply signal c[n] is at (VDD−Vth) and the transistor T21 starts to be turned on, where Vth is a threshold voltage of the transistor T20. After that, when the voltage level of the active control signal i[n] jumps to the operating voltage VSS, the transistor T22 is turned off while the transistor T21 is turned on, the operating voltage VDD is delivered to the source of the transistor T21 through the turned-on transistor T21, so that the voltage variation at the source of the transistor T21 is (VDD−VSS), and the voltage level of the preceding-stage supply signal c[n] is correspondingly changed to be (VDD−Vth+VDD−VSS=2VDD−VSS−Vth) by capacitive coupling effect.

In the following, an operation process of the shift register of the first embodiment will be described in detail with reference to FIGS. 1A and 1C. As depicted in FIG. 1C, in the pre-charge range, the preceding-stage output signal Pre[n] is at a logic high level, the active control signal i[n] is at a logic low (in the embodiment, the lowest voltage level in the system can define as logic low, i.e., generally the electronic representation of the binary digit "0") level, the transistors T26, T27 are turned off. Moreover, the voltage level of the preceding-stage supply signal c[n] is changed to be (2VDD−VS−Vth) greater than the operating voltage VDD resulting from the effect of the bootstrap inverter. At this time, the transistor T23 is turned on, the output control signal z[n] is at the level of VDD, the transistor T25 starts to turn on. Afterwards, in the active range, the active control signal i[n] is maintained at the logic low level, the transistors T26, T27 are maintained to be turned off, the transistor T25 is turned on, the logic high level of the input signal Φ1 is outputted as the logic high level of the current-stage output signal O[n] after passing through the turned-on transistor T25, meanwhile the voltage variation at the source of the transistor T25 is (VDD−VSS), the voltage level of the output control signal z[n] is pulled up to be (2VDD−VSS) resulting from the coupling effect of the capacitor C, the transistor T24 is turned on, the voltage level of the preceding-stage supply signal c[n] is changed to be VDD to turn off the transistor T23. The blocking of the transistor T23 can avoid the driving capability of the shift register SR[n] is influenced resulting from the voltage of the output control signal z[n] flowing into the operating voltage VDD.

It can be clearly found from FIG. 1C, the output control signal z[n] of the first embodiment in the pre-charge range can be up to the level of VDD, while the output control signal in the prior art only is (VDD−Vth) resulting from the loss of threshold voltage. Accordingly, the first embodiment can completely compensate the insufficient driving capability of shift register caused by the variation of threshold voltage Vth.

[Second Embodiment]

Figure 2:
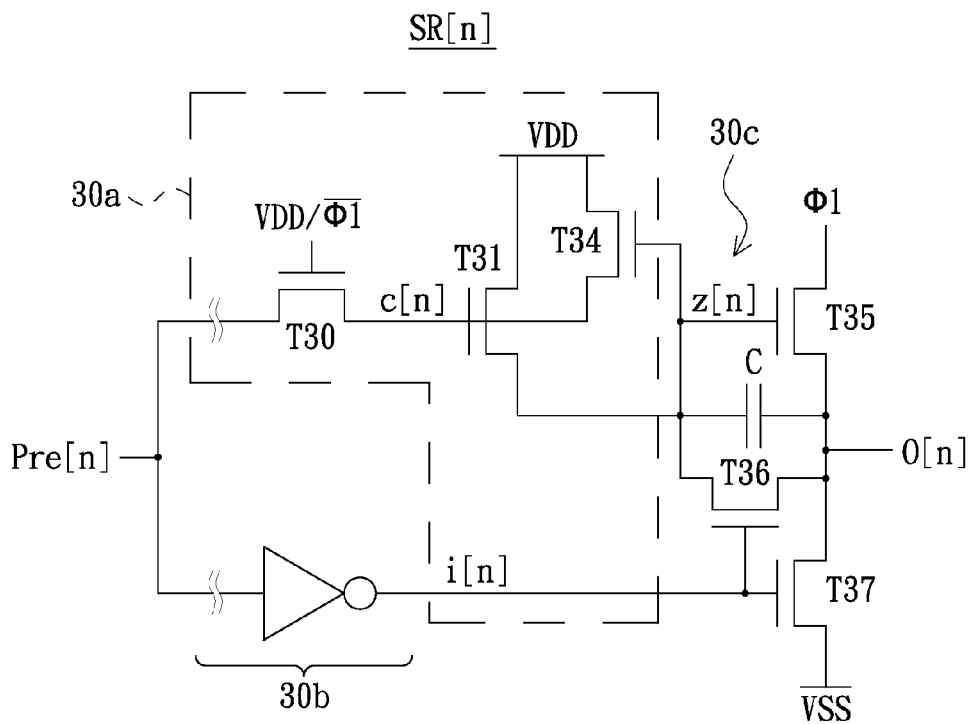
FIG. 2 is a schematic circuit structure of a single stage shift register in accordance with a second embodiment.

Referring to FIG. 2, a schematic circuit structure of a single stage shift register in accordance with the second embodiment. As depicted in FIG. 2, the shift register SR[n] includes a pre-charge controller 30a, an active controller 30b and an output circuit 30c. The pre-charge controller 30a includes n-type transistors T30, T31 and T34. The active controller 30b receives a preceding-stage output signal Pre[n] and thereby provides an active control signal i[n] corresponding to the preceding-stage output signal Pre[n], and a circuit structure thereof can be the same as well-known, and thus will not be described herein. The output circuit 30c includes n-type transistors T35, T36, T37 and a capacitor C. In the second embodiment, the transistors T31, T34, T36 and T37 cooperatively constitute a voltage boosting circuit. The transistors T31, T36 and T37 in the voltage boosting circuit constitute a bootstrap inverter.

In particular, the transistor T30 in the pre-charge controller 30a receives the preceding-stage output signal Pre[n] and determines whether delivering the preceding-stage output signal Pre[n] as a preceding-stage supply signal c[n] under the control of a control signal e.g., an operating voltage VDD or a phase-inverted signal $\overline{\Phi 1}$ of an input signal Φ1. The voltage boosting circuit constituted by the transistors T31, T34, T36 and T37 receives the operating voltage VDD, the preceding-stage supply signal c[n] and the active control signal i[n] and thereby generates an output control signal z[n]. In the second embodiment, the drain (first terminal) of the transistor T31 receives the operating voltage VDD, the gate (control terminal) of the transistor T31 receives the preceding-stage supply signal c[n], and thereby the transistor T31 is controlled by the preceding-stage supply signal c[n] to determine whether allowing the operating voltage VDD to be delivered to the source (second terminal) of the transistor T31 as the output control signal z[n]. The drain (first terminal) of the transistor T34 receives the operating voltage VDD, the source (second terminal) of the transistor T34 receives the preceding-stage supply signal c[n], the gate (control terminal) of the transistor T34 is electrically coupled to the source of the transistor T31 to receive the output control signal z[n], and thereby the transistor T34 is controlled by the output control signal z[n] to determine whether allowing the operating voltage VDD to be delivered to the source of the transistor T34. The drain (first terminal) of the transistor T36 is electrically coupled to the source of the transistor T31, the source (second terminal) of the transistor T36 receives the current-stage output signal O[n], the gate (control terminal) of the transistor T36 receives the active control signal i[n], and thereby on-off states of the transistor T36 are controlled by the active control signal i[n]. The drain (first terminal) of the transistor T37 receives the current-stage output signal O[n], the source (second terminal) of the transistor T37 receives another operating voltage VSS, the gate (control terminal) of the transistor T37 receives the active control signal i[n], and thereby on-off states of the transistor T37 are controlled by the active control signal i[n].

In the output circuit 30c, the drain of the transistor T35 receives the input signal Φ1, the source of the transistor T35 is electrically coupled to the gate of the transistor T35 through the capacitor C, the gate of the transistor T35 receives the output control signal z[n], and thereby the transistor T35 determines the time of outputting the input signal Φ1 to the source of the transistor T35 as the current-stage output signal O[n] according to the output control signal z[n]. In the second embodiment, a logic high level of the input signal Φ1 determines the logic high level (extreme value) of the current-stage output signal O[n].

It is noted that, the preceding-stage output signal Pre[n], the preceding-stage supply signal c[n], the active control signal i[n], the output control signal z[n] and the current-stage output signal O[n] used in the second embodiment may be the same as that used in the first embodiment, and an operation process of the shift register SR[n] in the second embodiment may be similar to that of the shift register SR[n] in the first embodiment, and thus will not be repeated hereby.

[Third Embodiment]

Figure 3:
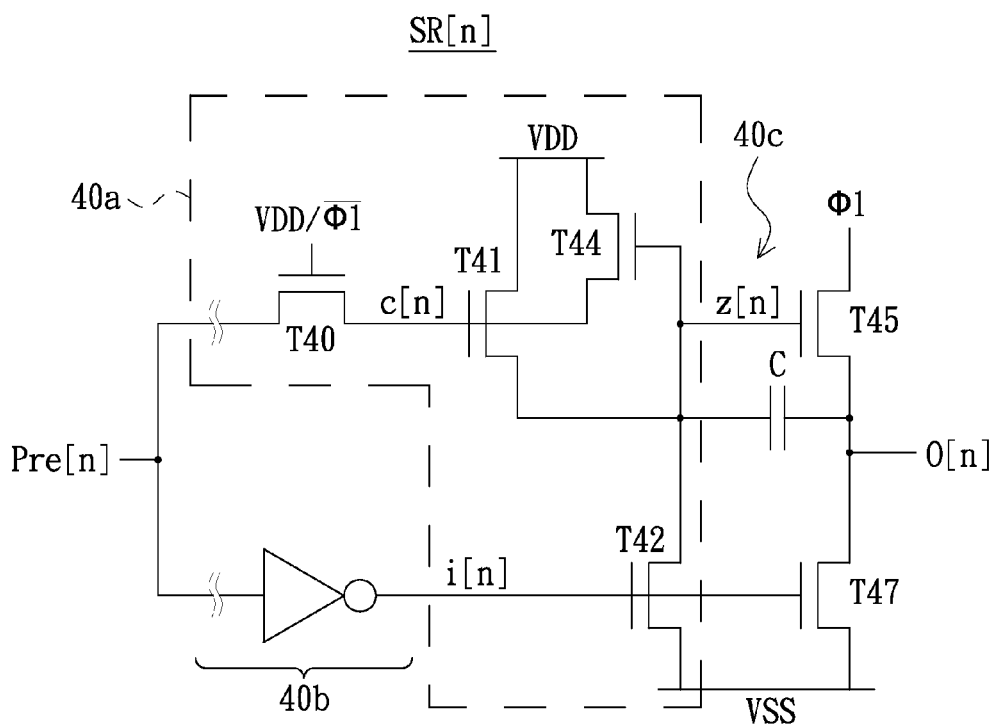
FIG. 3 is a schematic circuit structure of a single stage shift register in accordance with a third embodiment.

FIG. 3 is a schematic circuit structure of a single stage shift register in accordance with the third embodiment. As depicted in FIG. 3, the shift register SR[n] includes a pre-charge controller 40a, an active controller 40b and an output circuit 40c. The pre-charge controller 40a includes n-type transistors T40, T41, T42 and T44, and the transistors T41, T42, T44 cooperatively constitute a voltage boosting circuit. Moreover, the transistors T41, T42 constitute a bootstrap inverter. The active controller 40b receives a preceding-stage output signal Pre[n] and thereby provides an active control signal i[n] corresponding to the preceding-stage output signal Pre[n]. The active controller 40b can have a same structure as well-known, and thus will not be described herein. The output circuit 40c includes n-type transistors T45, T47 and a capacitor C.

In the pre-charge controller 40a, the transistor T40 receives the preceding-stage output signal Pre[n] and determines whether delivering the preceding-stage output signal Pre[n] as a preceding-stage supply signal c[n] under the control of a control signal e.g., an operating voltage VDD or a phase-inverted signal $\overline{\Phi 1}$ of an input signal Φ1. The voltage boosting circuit constituted by the transistors T41, T42 and T44 receives the operating voltage VDD, the preceding-stage supply signal c[n] and the active control signal i[n] and thereby provides an output control signal z[n]. In the third embodiment, the drain (first terminal) of the transistor T41 receives the operating voltage VDD, the gate (control terminal) of the transistor T41 receives the preceding-stage supply signal c[n], and thereby the transistor T41 is controlled by the preceding-stage supply signal c[n] to determine whether allowing the operating voltage VDD to be delivered to the source (second terminal) of the transistor T41 as the output control signal z[n]. The drain (first terminal) of the transistor T42 is electrically coupled to the source of the transistor T41, the source (second terminal) of the transistor T42 receives another operating voltage VSS, the gate (control terminal) of the transistor T42 receives the active control signal i[n], and thereby the transistor T42 is controlled by the active control signal i[n] to determine whether allowing the operating voltage VSS to be delivered to the drain of the transistor T42. The drain (first terminal) of the transistor T44 receives the operating voltage VDD, the source (second terminal) of the transistor T44 receives the preceding-stage supply signal c[n], the gate (control terminal) of the transistor T44 is electrically coupled to the source of the transistor T41 to receive the output control signal z[n], and thereby the transistor T44 is controlled by the output control signal z[n] to determine whether allowing the operating voltage VDD to be delivered to the source of the transistor T44.

In the output circuit 40c, the drain of the transistor T45 receives the input signal Φ1, the source of the transistor T45 is electrically coupled to the gate of the transistor T45 through the capacitor C, the gate of the transistor T45 receives the output control signal z[n], and thereby the transistor T45 is controlled by the output control signal z[n] to determine the time of outputting the input signal Φ1 to the source of the transistor T45 as the current-stage output signal O[n]. In the third embodiment, a logic high level of the input signal Φ1 determines the logic high level (extreme value) of the current-stage output signal O[n]. The drain of the transistor T47 is electrically coupled to the source of the transistor T45, the source of the transistor T47 receives the operating voltage VSS, and the gate of the transistor T47 receives the active control signal i[n].

It is noted that, the preceding-stage output signal Pre[n], the preceding-stage supply signal c[n], the active control signal i[n], the output control signal z[n] and the current-stage output signal O[n] used in the third embodiment may be the same as that used in the first embodiment, and an operation process of the shift register SR[n] in the third embodiment may be similar to that of the shift register SR[n] in the first embodiment, and thus will not be repeated hereby.

In addition, the transistors used by the shift register SR[n] in each of the first through third embodiments all are n-type, but not to limit the present invention, the shift register SR[n] proposed by the present invention can use p-type transistors instead, for example the illustrations of the following fourth through sixth embodiments.

[Fourth Embodiment]

Figure 4A:
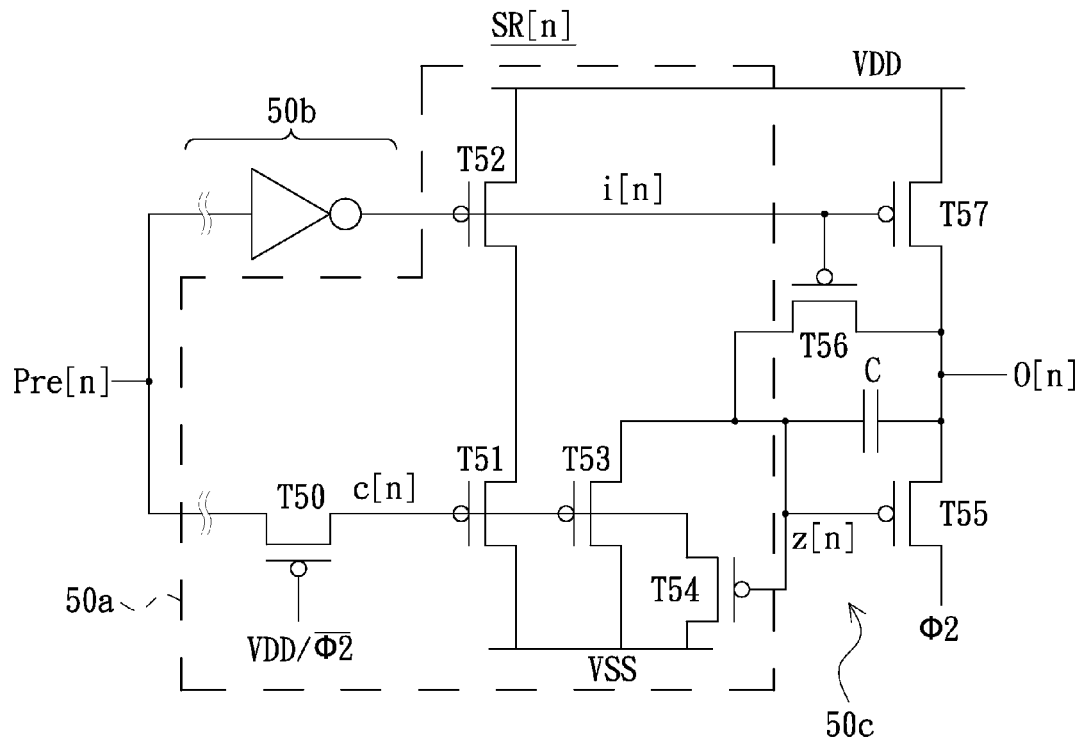
FIG. 4A is a schematic circuit structure of a single stage shift register in accordance with a fourth embodiment.

FIG. 4A is a schematic circuit structure of a single stage shift register in accordance with the fourth embodiment. As depicted in FIG. 4A, the shift register SR[n] includes a pre-charge controller 50a, an active controller 50b and an output circuit 50c. The pre-charge controller 50a includes p-type transistors T50, T51, T52, T53, T54, and the p-type transistors T51, T52, T53, T54 in the fourth embodiment cooperatively constitute a voltage boosting circuit. The transistors T51 and T52 in the voltage boosting circuit constitute a bootstrap inverter. The active controller 50b receives a preceding-stage output signal Pre[n] (e.g., an output signal of the not shown shift register SR[n−1] firstly preceding the shift register SR[n]) and thereby provides an active control signal i[n] corresponding to the preceding-stage output signal Pre[n]. The circuit structure of the active controller 50b can be the same as well-known, and thus will not be described herein. The output circuit 50c includes n-type transistors T55, T56, T57 and a capacitor C.

In the pre-charge controller 50a, the transistor T50 receives the preceding-stage output signal Pre[n] and subjected to the control of a control signal e.g., an operating voltage VSS or a phase-inverted signal $\overline{\Phi 2}$ of an input signal Φ2 to determine whether delivering the preceding-stage output signal Pre[n] as a preceding-stage supply signal c[n] for output. The voltage boosting circuit constituted by the transistors T51, T52, T53, T54 receives the operating voltage VSS, the preceding-stage supply signal c[n] and the active control signal i[n] and thereby generates an output control signal z[n]. In the fourth embodiment, the drain (first terminal) of the transistor T51 receives the operating voltage VSS, the gate (control terminal) of the transistor T51 receives the preceding-stage supply signal c[n], and thereby the transistor T51 is controlled by the preceding-stage output signal c[n] to determine whether allowing the operating voltage VSS to be delivered to the source (second terminal) of the transistor T51. The drain (first terminal) of the transistor T52 is electrically coupled to the source of the transistor T51, the source (second terminal) of the transistor T52 receives another operating voltage VDD the gate (control terminal) of the transistor T52 receives the active control signal i[n], and thereby the transistor T52 is controlled by the active control signal i[n] to determine whether allowing the operating voltage VDD to be delivered to the drain of the transistor T52. The drain (first terminal) of the transistor T53 receives the operating voltage VSS, the gate (control terminal) of the transistor T53 receives the preceding-stage supply signal c[n], and thereby the transistor T53 is controlled by the preceding-stage supply signal c[n] to determine whether allowing the operating voltage VSS to be delivered to the source (second terminal) of the transistor T53 as the output control signal z[n]. The drain (first terminal) of the transistor T54 receives the operating voltage VSS, the source (second terminal) of the transistor T54 receives the preceding-stage supply signal c[n], the gate (control terminal) of the transistor T54 is electrically coupled to the source of the transistor T53 to receive the output control signal z[n], and thereby the transistor T54 is controlled by the output control signal z[n] to determine whether allowing the operating voltage VSS to be delivered to the source of the transistor T54.

In the output circuit 50c, the drain of the transistor T55 receives the input signal Φ2, the source of the transistor T55 is electrically coupled to the gate of the transistor T55 through the capacitor C, the gate of the transistor T55 receives the output control signal z[n], and thereby the transistor T55 is controlled by the output control signal z[n] to determine the time of outputting the input signal Φ2 to the source of the transistor T55 as a current-stage output signal O[n]. In the fourth embodiment, a logic low level of the input signal Φ2 determines the logic low level (extreme value) of the current-stage output signal O[n]. The drain of the transistor T56 is electrically coupled to the gate of the transistor T55, the source of the transistor T56 is electrically coupled to the source of the transistor T55, and the gate of the transistor T56 receives the active control signal i[n]. The drain of the transistor T57 is electrically coupled to the source of the transistor T55, the source of the transistor T57 receives the operating voltage VDD, and the gate of the transistor T57 receives the active control signal i[n].

Figure 4B:
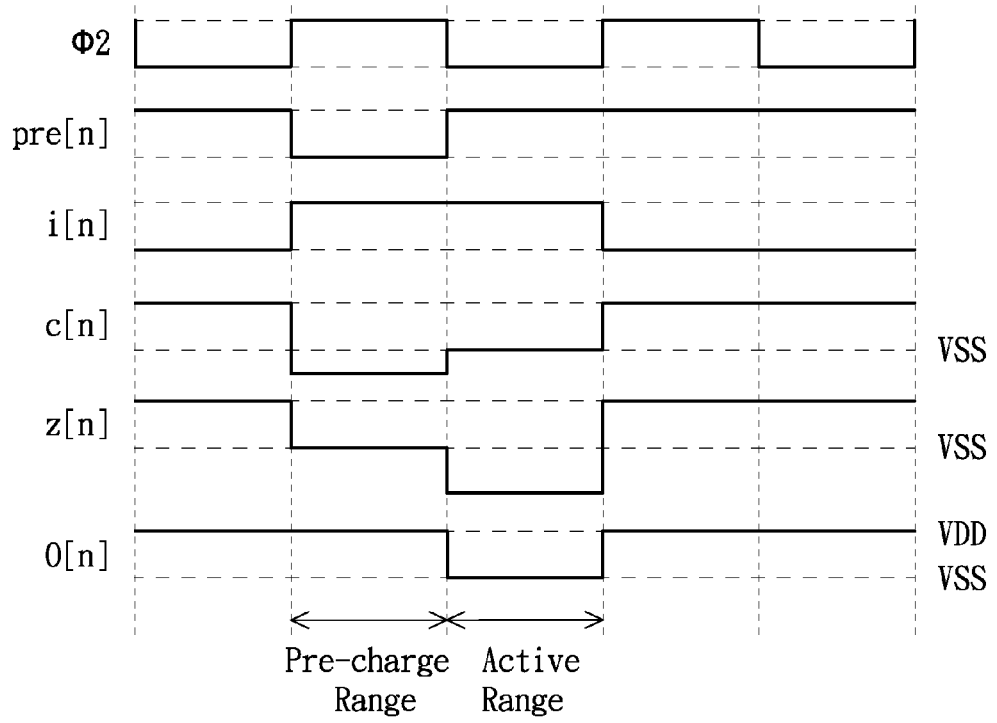
FIG. 4B is operation waveforms associated with the shift register of FIG. 4A.

Referring to FIGS. 4A and 4B together, FIG. 4B showing operation waveforms associated with the shift register SR[n] of the fourth embodiment. In the following, an operation process of the shift register of the fourth embodiment will be described in detail with reference to FIGS. 4A and 4B. As depicted in FIG. 4B, in the pre-charge range, the preceding-stage output signal Pre[n] is at a logic low level, the active control signal i[n] is at a logic high level, the transistors T56, T57 are turned off. Moreover, the voltage level of the preceding-stage supply signal c[n] is changed to be (2VSS−VDD−Vth) lower than the operating voltage VSS resulting from the effect of the bootstrap inverter. At this time, the transistor T53 is turned on, the output control signal z[n] is at the level of VSS, the transistor T55 starts to turn on. Afterwards, in the active range, the active control signal i[n] is maintained at the logic high level, the transistors T56, T57 are maintained to be turned off, the transistor T55 is turned on, the logic low level of the input signal Φ2 is outputted as the logic low level of the current-stage output signal O[n] after passing through the turned-on transistor T55, meanwhile the voltage variation at the source of the transistor T55 is (VSS−VDD), the voltage level of the output control signal z[n] is pulled down to be (2VSS−VDD) resulting from the coupling effect of the capacitor C, the transistor T54 is turned on, the voltage level of the preceding-stage supply signal c[n] is changed to be VSS to block the transistor T53. The blocking of the transistor T53 can avoid the driving capability of the shift register SR[n] is influenced resulting from the voltage of the output control signal z[n] flowing into the operating voltage VSS.

It can be clearly found from the above operation process of the shift register SR[n], the output control signal z[n] of the fourth embodiment in the pre-charge range can arrive at the level of VSS, which can completely compensate the insufficient driving capability of shift register caused by the variation of threshold voltage Vth.

[Fifth Embodiment]

Figure 5:
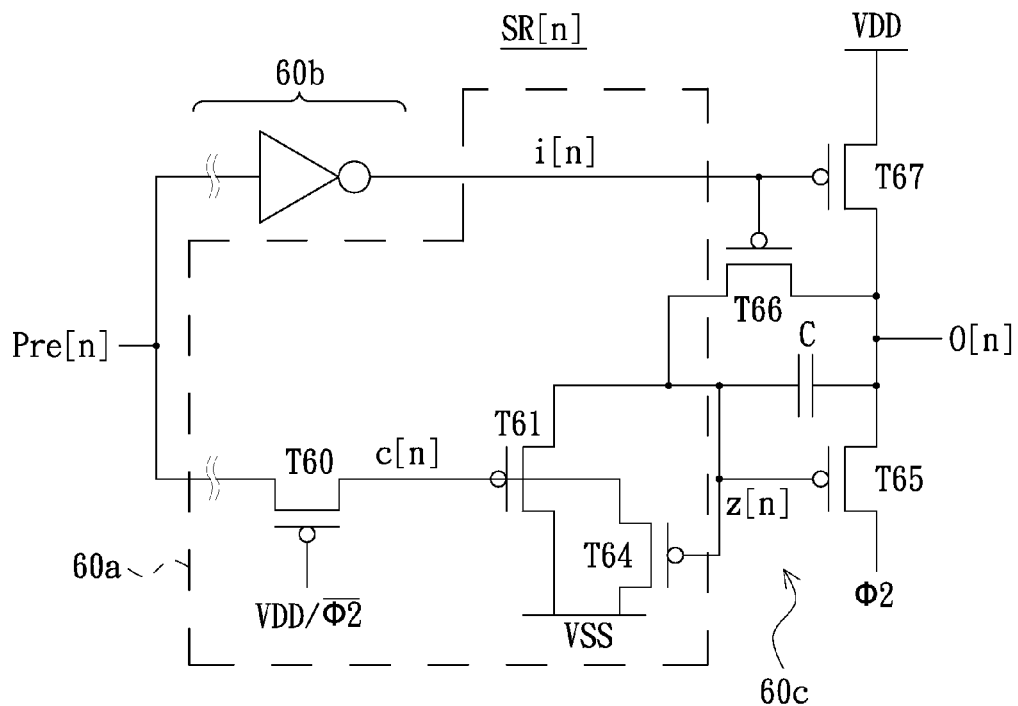
FIG. 5 is a schematic circuit structure of a single stage shift register in accordance with a fifth embodiment.

Referring to FIG. 5, a schematic circuit structure of a single stage shift register in accordance with the fifth embodiment. As depicted in FIG. 5, the shift register SR[n] includes a pre-charge controller 60a, an active controller 60b and an output circuit 60c. The pre-charge controller 60a includes p-type transistors T60, T61 and T64. The active controller 60b receives a preceding-stage output signal Pre[n] and thereby provides an active control signal i[n] corresponding to the preceding-stage output signal Pre[n], and a circuit structure thereof can be the same as well-known, and thus will not be described herein. The output circuit 60c includes p-type transistors T65, T66, T67 and a capacitor C. In the fifth embodiment, the transistors T61, T64, T66 and T67 cooperatively constitute a voltage boosting circuit. The transistors T61, T66 and T67 in the voltage boosting circuit constitute a bootstrap inverter.

In the pre-charge controller 60a, the transistor T60 receives the preceding-stage output signal Pre[n] and determines whether delivering the preceding-stage output signal Pre[n] as a preceding-stage supply signal c[n] under the control of a control signal e.g., an operating voltage VSS or a phase-inverted signal $\overline{\Phi 2}$ of an input signal Φ2. The voltage boosting circuit constituted by the transistors T61, T64, T66 and T67 receives the operating voltage VSS, the preceding-stage supply signal c[n] and the active control signal i[n] and thereby generates an output control signal z[n]. In the fifth embodiment, the drain (first terminal) of the transistor T61 receives the operating voltage VSS, the gate (control terminal) of the transistor T61 receives the preceding-stage supply signal c[n], and thereby the transistor T61 is controlled by the preceding-stage supply signal c[n] to determine whether allowing the operating voltage VSS to be delivered to the source (second terminal) of the transistor T61 as the output control signal z[n]. The drain (first terminal) of the transistor T64 receives the operating voltage VSS, the source (second terminal) of the transistor T64 receives the preceding-stage supply signal c[n], the gate (control terminal) of the transistor T64 is electrically coupled to the source of the transistor T61 to receive the output control signal z[n], and thereby the transistor T64 is controlled by the output control signal z[n] to determine whether allowing the operating voltage VSS to be delivered to the source of the transistor T64. The drain (first terminal) of the transistor T66 is electrically coupled to the source of the transistor T61, the source (second terminal) of the transistor T66 receives the current-stage output signal O[n], the gate (control terminal) of the transistor T66 receives the active control signal i[n], and thereby on-off states of the transistor T66 are controlled by the active control signal i[n]. The drain (first terminal) of the transistor T67 receives the current-stage output signal O[n], the source (second terminal) of the transistor T67 receives another operating voltage VDD, the gate (control terminal) of the transistor T67 receives the active control signal i[n], and thereby on-off states of the transistor T67 are controlled by the active control signal i[n].

In the output circuit 60c, the drain of the transistor T65 receives the input signal Φ2, the source of the transistor T65 is electrically coupled to the gate of the transistor T65 through the capacitor C, the gate of the transistor T65 receives the output control signal z[n], and thereby the transistor T65 determines the time of outputting the input signal Φ2 to the source of the transistor T65 as the current-stage output signal O[n] according to the output control signal z[n]. In the fifth embodiment, a logic low level of the input signal Φ2 determines the logic low level (extreme value) of the current-stage output signal O[n].

It is noted that, the preceding-stage output signal Pre[n], the preceding-stage supply signal c[n], the active control signal i[n], the output control signal z[n] and the current-stage output signal O[n] used in the fifth embodiment may be the same as that used in the fourth embodiment, and an operation process of the shift register SR[n] in the fifth embodiment may be similar to that of the shift register SR[n] in the fourth embodiment, and thus will not be repeated hereby.

[Sixth Embodiment]

Figure 6:
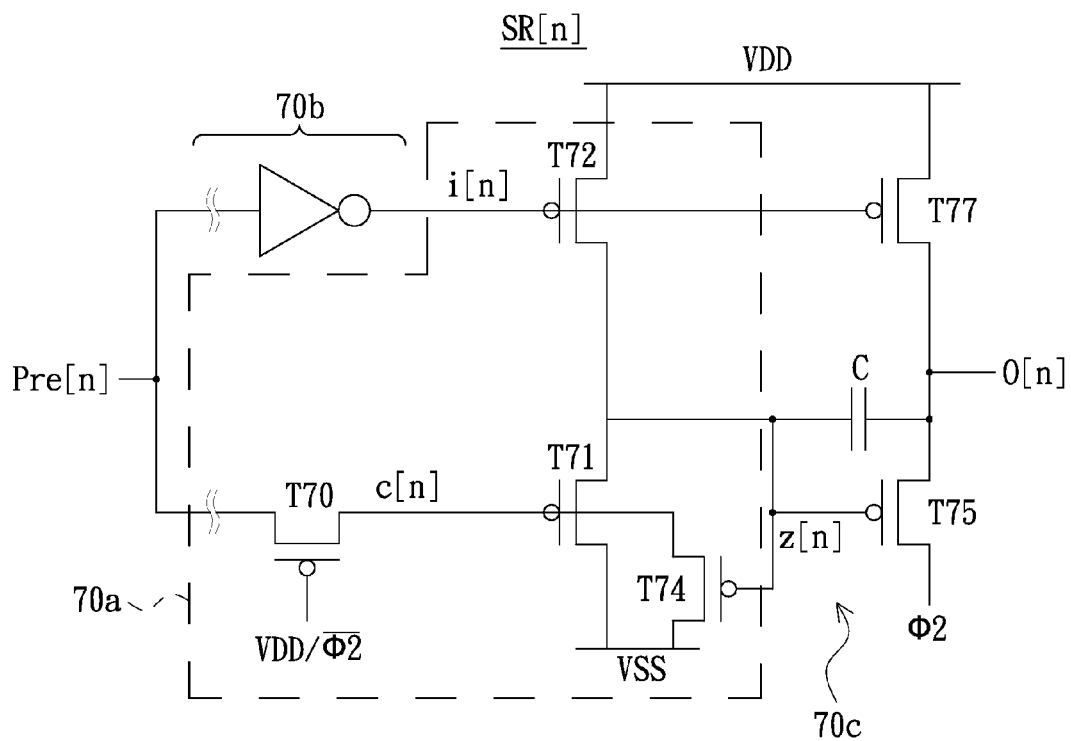
FIG. 6 is a schematic circuit structure of a single stage shift register in accordance with a sixth embodiment.

Referring to FIG. 6, a schematic circuit structure of a single stage shift register in accordance with the sixth embodiment is shown. As depicted in FIG. 6, the shift register SR[n] includes a pre-charge controller 70a, an active controller 70b and an output circuit 70c. The pre-charge controller 70a includes p-type transistors T70, T71, T72 and T74, and the transistors T71, T72, T74 cooperatively constitute a voltage boosting circuit. Moreover, the transistors T71, T72 constitute a bootstrap inverter. The active controller 70b receives a preceding-stage output signal Pre[n] and thereby provides an active control signal i[n] corresponding to the preceding-stage output signal Pre[n]. The active controller 70b can have a same structure as well-known, and thus will not be described herein. The output circuit 70c includes p-type transistors T75, T77 and a capacitor C.

In the pre-charge controller 70a, the transistor T70 receives the preceding-stage output signal Pre[n] and determines whether delivering the preceding-stage output signal Pre[n] as a preceding-stage supply signal c[n] under the control of a control signal e.g., an operating voltage VSS or a phase-inverted signal $\overline{\Phi 2}$ of an input signal Φ2. The voltage boosting circuit constituted by the transistors T71, T72 and T74 receives the operating voltage VSS, the preceding-stage supply signal c[n] and the active control signal i[n] and thereby provides an output control signal z[n]. In the sixth embodiment, the drain (first terminal) of the transistor T71 receives the operating voltage VSS, the gate (control terminal) of the transistor T71 receives the preceding-stage supply signal c[n], and thereby the transistor T71 is controlled by the preceding-stage supply signal c[n] to determine whether allowing the operating voltage VSS to be delivered to the source (second terminal) of the transistor T71 as the output control signal z[n]. The drain (first terminal) of the transistor T72 is electrically coupled to the source of the transistor T71, the source (second terminal) of the transistor T72 receives another operating voltage VDD, the gate (control terminal) of the transistor T72 receives the active control signal i[n], and thereby the transistor T72 is controlled by the active control signal i[n] to determine whether allowing the operating voltage VDD to be delivered to the drain of the transistor T72. The drain (first terminal) of the transistor T74 receives the operating voltage VSS, the source (second terminal) of the transistor T74 receives the preceding-stage supply signal c[n], the gate (control terminal) of the transistor T74 is electrically coupled to the source of the transistor T71 to receive the output control signal z[n], and thereby the transistor T74 is controlled by the output control signal z[n] to determine whether allowing the operating voltage VSS to be delivered to the source of the transistor T74.

In the output circuit 70c, the drain of the transistor T75 receives the input signal Φ2, the source of the transistor T75 is electrically coupled to the gate of the transistor T75 through the capacitor C, the gate of the transistor T75 receives the output control signal z[n], and thereby the transistor T75 is controlled by the output control signal z[n] to determine the time of outputting the input signal Φ2 to the source of the transistor T75 as the current-stage output signal O[n]. In the sixth embodiment, a logic low level of the input signal Φ2 determines the logic low level (extreme value) of the current-stage output signal O[n]. The drain of the transistor T77 is electrically coupled to the source of the transistor T75, the source of the transistor T77 receives the operating voltage VDD, and the gate of the transistor T77 receives the active control signal i[n].

It is noted that, the preceding-stage output signal Pre[n], the preceding-stage supply signal c[n], the active control signal i[n], the output control signal z[n] and the current-stage output signal O[n] used in the sixth embodiment may be the same as that used in the fourth embodiment, and an operation process of the shift register SR[n] in the sixth embodiment may be similar to that of the shift register SR[n] in the fourth embodiment, and thus will not be repeated hereby.

Sum up, in the various embodiments, by adding the voltage boosting circuit in the shift register, facilitating the voltage level of the output control signal in the pre-charge range of the shift register to approximately arrive at the operating voltage VDD or VSS, so that the insufficient driving capability of the shift register caused by the process variation of threshold voltage can be compensated, achieving the purpose of developing the present invention.

While the invention has been described in terms of what is presently considered to be the most practical embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A shift register adapted for receiving a preceding-stage output signal to thereby generate a preceding-stage supply signal and outputting an input signal as an extreme value of a current-stage output signal according to the preceding-stage supply signal, the shift register comprising:

an active controller, for receiving the preceding-stage output signal and thereby provide an active control signal corresponding to the preceding-stage output signal;

a voltage boosting circuit, for receiving a first operating voltage, the preceding-stage supply signal and the active control signal, wherein the voltage boosting circuit uses a capacitive coupling effect to change a voltage value of the preceding-stage supply signal and thereby generates an output control signal; and an output circuit, electrically coupled to the voltage boosting circuit, the active controller and the input signal, wherein the output circuit is subjected to the control of the output control signal generated from the voltage boosting circuit to determine the time of outputting the input signal as the extreme value of the current-stage output signal;

wherein the voltage boosting circuit comprises:

a first transistor, including a control terminal, a first terminal and a second terminal, wherein the control terminal of the first transistor receives the preceding-stage supply signal, the first terminal of the first transistor receives the first operating voltage, and thereby the first transistor is controlled by the preceding-stage supply signal to determine whether allowing the first operating voltage to be delivered to the second terminal of the first transistor as the output control signal;

a second transistor, including a control terminal, a first terminal and a second terminal, wherein the control terminal of the second transistor receives the active control signal, the first terminal of the second transistor is electrically coupled to the second terminal of the first transistor, the second terminal of the second transistor receives the current-stage output signal, and thereby on-off states of the second transistor is controlled by the active control signal;

a third transistor, including a control terminal, a first terminal and a second terminal, wherein the control terminal of the third transistor is electrically coupled to the second terminal of the first transistor to receive the output control signal the first terminal of the third transistor receives the first operating voltage, the second terminal of the third transistor receives the preceding-stage supply signal, and thereby the third transistor is controlled by the output control signal to determine whether allowing the first operating voltage to be delivered to the second terminal of the third transistor; and a fourth transistor, including a control terminal, a first terminal and a second terminal, wherein the control terminal of the fourth transistor receives the active control signal, the first terminal of the fourth transistor receives the current-stage output signal the second terminal of the fourth transistor receives a second operating voltage, and thereby on-off states of the fourth transistor is controlled by the active control signal.

2. The shift register as claimed in claim 1, wherein the output circuit comprises a transistor being received the input signal and the output control signal, and thereby the transistor is subjected to the control of the output control signal to determine the time of outputting the input signal as the extreme value of the current-stage output signal.

3. The shift register as claimed in claim 1, wherein the voltage boosting circuit comprises:

a first transistor, including a control terminal, a first terminal and a second terminal, wherein the control terminal of the first transistor receives the preceding-stage supply signal, the first terminal of the first transistor receives the first operating voltage, and thereby the first transistor is controlled by the preceding-stage supply signal to determine whether allowing the first operating voltage to be delivered to the second terminal of the first transistor as the output control signal;

a second transistor, including a control terminal, a first terminal and a second terminal, wherein the control terminal of the second transistor receives the active control signal, the first terminal of the second transistor is electrically coupled to the second terminal of the first transistor, the second terminal of the second transistor receives a second operating voltage, and thereby the second transistor is controlled by the active control signal to determine whether allowing the second operating voltage to be delivered to the first terminal of the second transistor; and a third transistor, including a control terminal, a first terminal and a second terminal, wherein the control terminal of the third transistor is electrically coupled to the second terminal of the first transistor to receive the output control signal, the first terminal of the third transistor receives the first operating voltage, the second terminal of the third transistor receives the preceding-stage supply signal, and thereby the third transistor is controlled by the output control signal to determine whether allowing the first operating voltage to be delivered to the second terminal of the third transistor.

4. The shift register as claimed in claim 1, wherein the voltage boosting circuit comprises a bootstrap inverter, and the bootstrap inverter receives the first operating voltage, the preceding-stage supply signal and the active control signal and thereby generates the output control signal.

5. The shift register as claimed in claim 1, further comprising:

a transistor, wherein the transistor receives the preceding-stage output signal and subjected to the control of a preset control signal to determine whether delivering the preceding-stage output signal as the preceding-stage supply signal.

6. The shift register as claimed in claim 5, wherein the voltage level of the output control signal is not relevant to a threshold voltage of the transistor in a pre-charge range of the shift register.

7. The shift register as claimed in claim 6, wherein the voltage level of the output control signal in the pre-charge range of the shift register is substantially equal to the first operating voltage.

8. The shift register as claimed in claim 5, wherein the preset control signal comprises the first operating voltage or a phase-inverted signal of the input signal.

* * * * *